Nov. 24, 1970 H. FLAIG 3,543,186

FREQUENCY STABILIZED CRYSTAL CONTROLLED TRANSISTOR OSCILLATOR

Filed Sept. 4, 1968

INVENTOR.

Hans Flaig

BY Laurence R. Brown

Attorney

United States Patent Office 3,543,186
Patented Nov. 24, 1970

3,543,186
FREQUENCY STABILIZED CRYSTAL CONTROLLED TRANSISTOR OSCILLATOR

Hans Flaig, Schramberg-Sulgen, Wurttemberg, Germany, assignor to Messrs. Gebruder Junghans Gesellschaft mit beschrankter Haftung, Schramberg, Wurttemberg, Germany, a corporation of Germany Filed Sept. 4, 1968, Ser. No. 757,411
Claims priority, application Germany, Sept. 14, 1967, 1,591,218
Int. Cl. H03b 5/36
U.S. Cl. 331—116 9 Claims

ABSTRACT OF THE DISCLOSURE

A crystal controlled transistor oscillator circuit has temperature and frequency control components in a $\pi$ network arrangement coupled to the base of a grounded-emitter circuit with feedback from an inductor-choke in the collector circuit. A transistorized inverting isolation circuit of the grounded-emitter configuration is coupled to process oscillator output waveforms.

This invention relates to a crystal controlled transistor oscillator circuit, and more particularly to one producing frequency stabilized oscillations.

One known oscillator uses the feedback path of the conductive path between collector and base of the transistor. This feedback circuit is dependent upon the characteristics of the transistor, the temperature, the driving voltage and the frequency. At lower oscillator frequencies it is not even assured that the circuit will oscillate.

It is an object of this invention to provide a crystal controlled transistor oscillator that operates at lower frequencies, and within known limits will oscillate with certainty, which is not sensitive to temperature or voltage changes, which uses little energy and operates at low voltages.

Further it is an object of this invention to provide an oscillator with a steeply rising and falling output waveform which can properly drive bistable off-on circuits.

Another object of the invention is to provide a low cost oscillator with few small parts.

These foregoing problems are corrected and objectives are attained by a transistor oscillator circuit with a $\pi$ network having its connecting link with the crystal and at least one condensor with at last a condensor in each leg. This $\pi$ network has one side connected to the input circuit and the other side to a feedback condensor from the output circuit of a common emitter configuration oscillation transistor. To the base of this transistor is connected a resistor and to the collector an inductor choke with an iron core, each connected to the same pole of a voltage source. The emitter is connected to the other pole of the voltage source. Coupled to the oscillator circuit is an isolating inverting stage.

The lowest possible output frequency of the oscillator is the fundamental frequency of the crystal. In series with the crystal is an adjustment to alter the oscillator frequency within limits and extend the frequency range. It is also possible to stabilize the frequency with temperature changes. The inductive choke between one pole of the voltage source and the collector of the transistor permits a small energy component with a large resistance to current changes, so that the energy consumption of the oscillator is very small. Through appropriate value of this choke the oscillator frequency can be made fully independent from voltage fluctuations which occur during the lifetime of a battery. It is thus possible because of these measures to operate the oscillator with a lower voltage source and such small energy consumption that a single battery cell will drive the oscillator at a stable frequency over a long time period. Thus the oscillator requires such small voltage for driving and the oscillator is independent from the voltage changes in a battery cell fully charged and uses the same energies until the output voltage changes and finally sinks to a lower limit.

In the succeeding inverter-isolator stage the output waveform of the primary transistor is so shaped that the rise times are suitable for reliable bistable on-off circuit application.

Also an adjustable condensor circuit is selected in one embodiment. The adjustable condensor can change the oscillation frequency established by the crystal, and can have another condensor connected in parallel with a temperature characteristic chosen to stabilize any changes of oscillator frequency with changes of temperature. One such condensor has a bimetallic plate, but it is also possible to use a diode with a temperature dependent capacity characteristic as the parallel capacitor.

In order to produce the apparatus with lowest possible size and cost, it is convenient to place the transistorized inverter isolator circuit and the oscillator circuit in separate units for simple replacement, and with each transistor driven in a common emitter configuration. In a similar arrangement it is also possible to have a complementary invertor-isolator transistor driven from the oscillator in a common collector configuration.

Further advantageous features and objectives of the crystal controlled transistor oscillator of this invention are found throughout the following description of an embodiment shown in the drawing, wherein.

Figure 1:
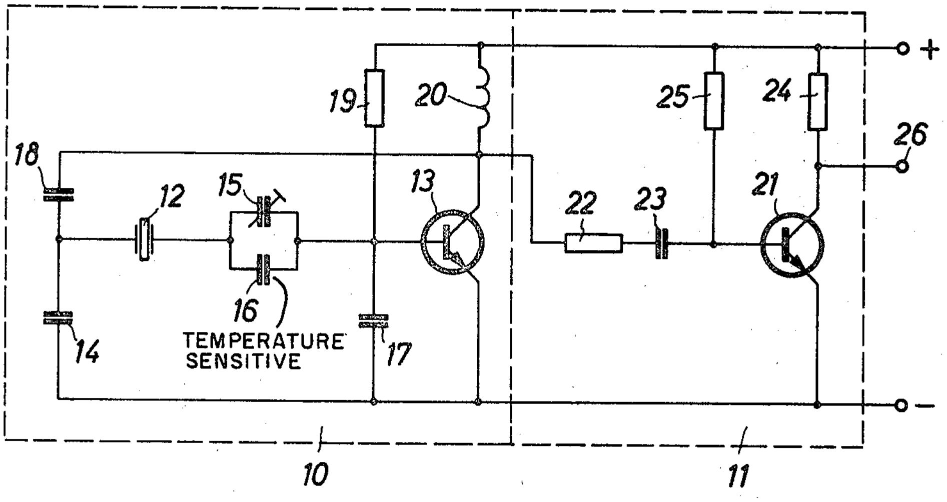
FIG. 1 is a circuit diagram of a crystal controlled transistor oscillator.

The circuit diagram of FIG. 1 is divided by dotted line boxes into the oscillator circuit 10 and the inverting isolation stage 11. The principal component of the oscillator circuit 10 is the quartz crystal 12. It is connected in the base-emitter circuit of transistor 13 in series with a condenser 14 and two parallel condensers 15 and 16 as illustrated. Connected in parallel with this series circuit across the base-emitter path is a further condenser 17. From the collector of transistor 13 is coupled a condenser 18 which connects to the base of transistor 13 through quartz crystal 12. A direct connection is made between the emitter of transistor 13 and the negative pole of a voltage source (not shown). A connection is made between the positive pole of the voltage source and the base through resistor 19, and the positive pole to the collector through a high inductance choke, for example, an iron core choke 20.

Of the two capacitors 15, 16 shown in the series circuit, one is a manually adjustabe condenser 15, whose purpose is to change frequency, which serves to alter the effective resonance frequency of the oscillator crystal 12 while the parallel condenser 16 operates with the temperature to regulate the oscillator to eliminate any drift of frequency with temperature. This latter capacitor can be made with bimetallic plates or can comprise a diode with temperature dependent capacity.

Figure 2:
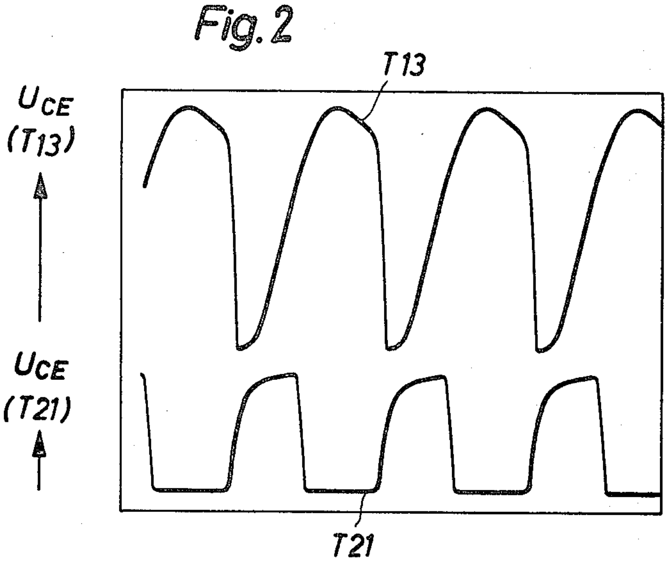
FIG. 2 is an oscillogram of the output voltage waveforms of the oscillator circuit and the inverted waveform at the amplifier stage.

The voltage between emitter and collector of transistor 13 is shown in FIG. 2 by curve T–13. It is desirable for the control of bistable elements to have available a voltage waveform with shortest possible rise time so that the collector-emitter voltage T–13 in its switching reversal avoids any change of phase, whereby the output of transistor 21 whose switching reversal in the lower section of FIG. 2 labelled as voltage waveform T–21 can be provided.

The connection from the collector of the oscillator transistor 13 is made through resistor 22 and condenser 23 to the base of inverter transistor 21. The emitter of transistor 21 is directly connected to the negative pole of the voltage source, while the base and collector are connected to the positive terminal of the voltage source respectively through the inserted resistors 25 and 24. At the collector terminal 26, the output voltage of transistor 21 reproduced by the inverter-isolation stage 11 is shown in FIG. 2 as the voltage waveform T–21 provided for control of a succeeding stage such as a bistable flip-flop device.

In accordance with the mode of the invention in the foregoing oscillator it is possible to operate a crystal controlled transistor oscillator with much lower driving voltage while retaining stable oscillation frequency in the presence of voltage and temperature changes and whose output waveform is very little dependent upon the amplitude of the driving waveform. Thus, the succeeding flip-flop can be driven with precision to provide an output waveform also little dependent upon temperature changes and operable with a very low current consumption, so that it can be operated over long periods from a single battery cell.

One could omit the voltage stabilization apparatus and succeeding amplifier in order to simplify the circuit and permit the oscillator to be built inexpensively and compact.

The construction details of an exemplary transistor oscillator circuit and components are as follows:

Crystal 12—12,800 kHz Valvo, Class I SQ 4801-Halter B 98/72
Transistor 13/21—DW6192
Condenser 14—2.2 nf.
Condenser 15—1.5–5.5 pf.
Condenser 16—24 pf.
Condenser 17—.68 nf.
Condenser 18—1 nf.
Resistor 19—470 KΩ
Inductor 20—Iron core, 19 k., 2800 windings .05 cuL
Resistor 22—100KΩ
Condenser 23—1 nf.
Resistor 24—47 KΩ
Resistor 25—560 KΩ
Battery source—1.5 v.

What is claimed is:

1. Crystal stabilized transistor oscillator equipment comprising in combination, an oscillator transistor with an emitter, base and collector circuit connected in a grounded emitter configuration, a $\pi$ network with at least a crystal and condenser in series connected with extending legs each consisting of a condenser connected to the emitter of said transistor, a circuit coupling one side of the $\pi$ network to the transistor base; a condenser coupling the other side of the $\pi$ network to the output collector circuit of the transistor, a source of potential, a resistor connecting one pole of the source of potential to the said base, an inductor connecting said collector to said pole of said source of potential, a circuit connecting the other pole of the source of potential to said emitter and an output circuit coupled to said collector.

2. Apparatus as defined in claim 1 with an inverting transistorized isolation stage coupled to the transistor oscillator circuit collector.

3. Apparatus as defined in claim 1 wherein the first mentioned condenser is adjustable.

4. Apparatus as defined in claim 3, including a temperature compensating condenser coupled in parallel with said adjustable condenser.

5. Apparatus as defined in claim 4 wherein the temperature compensating condenser has a bimetal plate.

6. Apparatus as defined in claim 4 wherein the temperature compensating condenser is a diode with temperature dependent capacity.

7. Apparatus as defined in claim 2 including an inverting transistorized isolation stage coupled to the oscillator circuit with both transistors of grounded emitter configuration.

8. Apparatus as defined in claim 7 wherein the inverting stage operates from the same source of potential as the oscillator stage.

9. Apparatus as defined in claim 7 wherein the inverting stage has a transistor with base, emitter and collector electrodes, the base of the inverting stage is connected to the transistor oscillator collector by a series resistor and capacitor, and the emitters of the two transistors are commonly connected.

References Cited

UNITED STATES PATENTS 3,350,662 10/1967 Harper ............ 331—116
3,373,379 3/1968 Black ............ 331—176 X
3,398,380 8/1968 Dwyer ............ 331—116 X
3,404,298 10/1968 Roberts ............ 331—176 X ROY LAKE, Primary Examiner S. H. GRIMM, Assistant Examiner U.S. Cl. X.R.

331—176